United States Patent [19]
Steele

[11] Patent Number: 6,123,314
[45] Date of Patent: Sep. 26, 2000

[54] QUICK MOUNTING MECHANISM AND METHOD

[75] Inventor: Harold E. Steele, Scottsboro, Ala.

[73] Assignee: Lockheed Martin Corporation, Bethesda, Md.

[21] Appl. No.: 08/347,025

[22] Filed: Nov. 30, 1994

[51] Int. Cl.[7] .................................................. F16M 1/00
[52] U.S. Cl. ...................... 248/681; 248/222.11; 248/309
[58] Field of Search .............................. 248/500, 221.12, 248/222.11, 222.41, 225.11, 681, 221.11, 223.21, 309; 211/192

[56] References Cited

U.S. PATENT DOCUMENTS

| | | |
|---|---|---|
| 46,472 | 2/1865 | Jenks . |
| 106,382 | 8/1870 | Maulding et al. . |
| 261,939 | 8/1882 | May . |
| 706,870 | 8/1902 | Wood ...................... 248/215 |
| 874,014 | 12/1907 | Kurtzon .............. 248/221.12 |
| 1,235,075 | 7/1917 | Stamm . |
| 1,838,352 | 12/1931 | Anderson . |
| 1,898,835 | 2/1933 | Henderson . |
| 2,127,280 | 8/1938 | Zimbalist ................ 248/243 |
| 2,603,167 | 7/1952 | Webster et al. ............. 105/369 |
| 2,859,008 | 11/1958 | Zimmer ................... 248/223 |
| 2,884,221 | 4/1959 | Messier ................... 248/361 |
| 2,932,368 | 4/1960 | Schell, Jr. ................ 189/36 |
| 2,936,146 | 5/1960 | Wunder ................... 248/201 |
| 2,957,671 | 10/1960 | Messier ................... 248/223 |
| 3,028,937 | 4/1962 | Grabowski et al. ......... 189/34 |
| 3,042,221 | 7/1962 | Rasmussen .............. 211/148 |
| 3,055,462 | 9/1962 | Steele ....................... 189/36 |
| 3,070,237 | 12/1962 | Fullerton et al. .......... 211/147 |
| 3,159,368 | 12/1964 | Ahlbin et al. .............. 248/225 |
| 3,271,059 | 9/1966 | Pearson ................ 287/189.36 |
| 3,273,720 | 9/1966 | Seiz ......................... 211/148 |
| 3,303,937 | 2/1967 | McConnell .............. 211/148 |
| 3,346,126 | 10/1967 | Bloom et al. ............. 211/176 |
| 3,392,848 | 7/1968 | McConnell et al. ...... 211/176 |
| 3,414,224 | 12/1968 | Robilliard et al. ........ 248/243 |
| 3,456,970 | 7/1969 | Sunasky ............... 287/189.35 |
| 3,612,290 | 10/1971 | Evans ..................... 211/176 |
| 3,702,137 | 11/1972 | Evans ..................... 211/176 |
| 3,730,108 | 5/1973 | Stroh ...................... 108/108 |
| 3,731,956 | 5/1973 | Hanley ................ 248/221.12 |
| 3,846,944 | 11/1974 | Lambert ................ 52/758 R |
| 3,880,396 | 4/1975 | Freiberger et al. ........ 248/475 R |
| 3,905,712 | 9/1975 | McConnell .............. 403/317 |
| 3,910,593 | 10/1975 | Schwarz .............. 280/11.87 E |
| 3,977,688 | 8/1976 | Imagawa .................. 280/633 |
| 3,986,318 | 10/1976 | McConnell .............. 52/758 R |
| 4,042,201 | 8/1977 | O'Callaghan .......... 248/222.11 |
| 4,094,485 | 6/1978 | O'Callaghan .......... 248/222.11 |
| 4,132,426 | 1/1979 | Svoboda et al. ........ 280/11.37 E |
| 4,165,944 | 8/1979 | Sunasky ................... 403/254 |
| 4,470,716 | 9/1984 | Welch ..................... 403/254 |
| 5,025,937 | 6/1991 | King ....................... 211/192 |
| 5,165,640 | 11/1992 | Williams, 3rd .......... 248/221.2 |

FOREIGN PATENT DOCUMENTS

| | | | |
|---|---|---|---|
| 286992 | 3/1953 | Switzerland ............ 248/201 |

OTHER PUBLICATIONS

*DZUS Fast Fastening: TL800 Series,* pp. 76 and 77 (DZUS Fastner Company, Inc.).
*DZUS Quick–Acting Fasteners,* Catalog A21 (DZUS Fastener Co. Inc., West Islip, NY, 1995) pp. 4–18.

*Primary Examiner*—Anita M. King
*Attorney, Agent, or Firm*—Stanton D. Weinstein; Robert S. Hulse; Patrick M. Hogan

[57] ABSTRACT

Apparatus and method are provided for releasably connecting to a base or assembly a box or the like such as an electrical module. Opposite mutually parallel sides of the box are each provided with a pair of projections having distal heads wider than their exposed shafts. The base or assembly is provided with a pair of parallel plates or angle irons sufficiently separated to accommodate the box and each provided with a pair of openings positioned and configured to receive and retain one of the projections. Preferably, each such opening has a right angle bend. For mounting, the box is placed on the base or assembly between the two plates or angle brackets such that each of the projections enters one of the openings. A right angle bend in the opening permits the opening to releasably retain that projection. At least one of the openings on each side is provided with a latch and a bail configured to releasably engage such a projection when the projection is disposed in the opening.

10 Claims, 8 Drawing Sheets

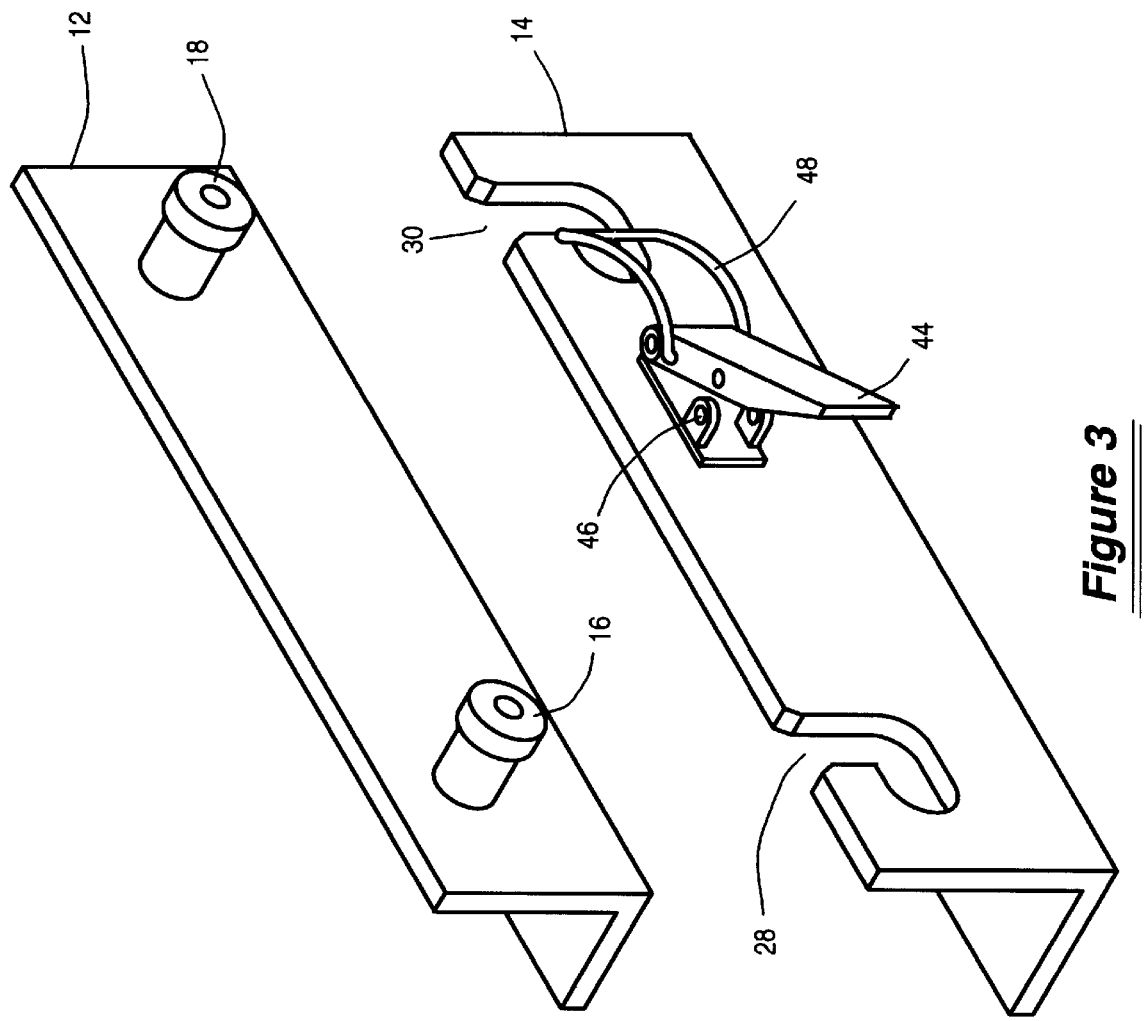

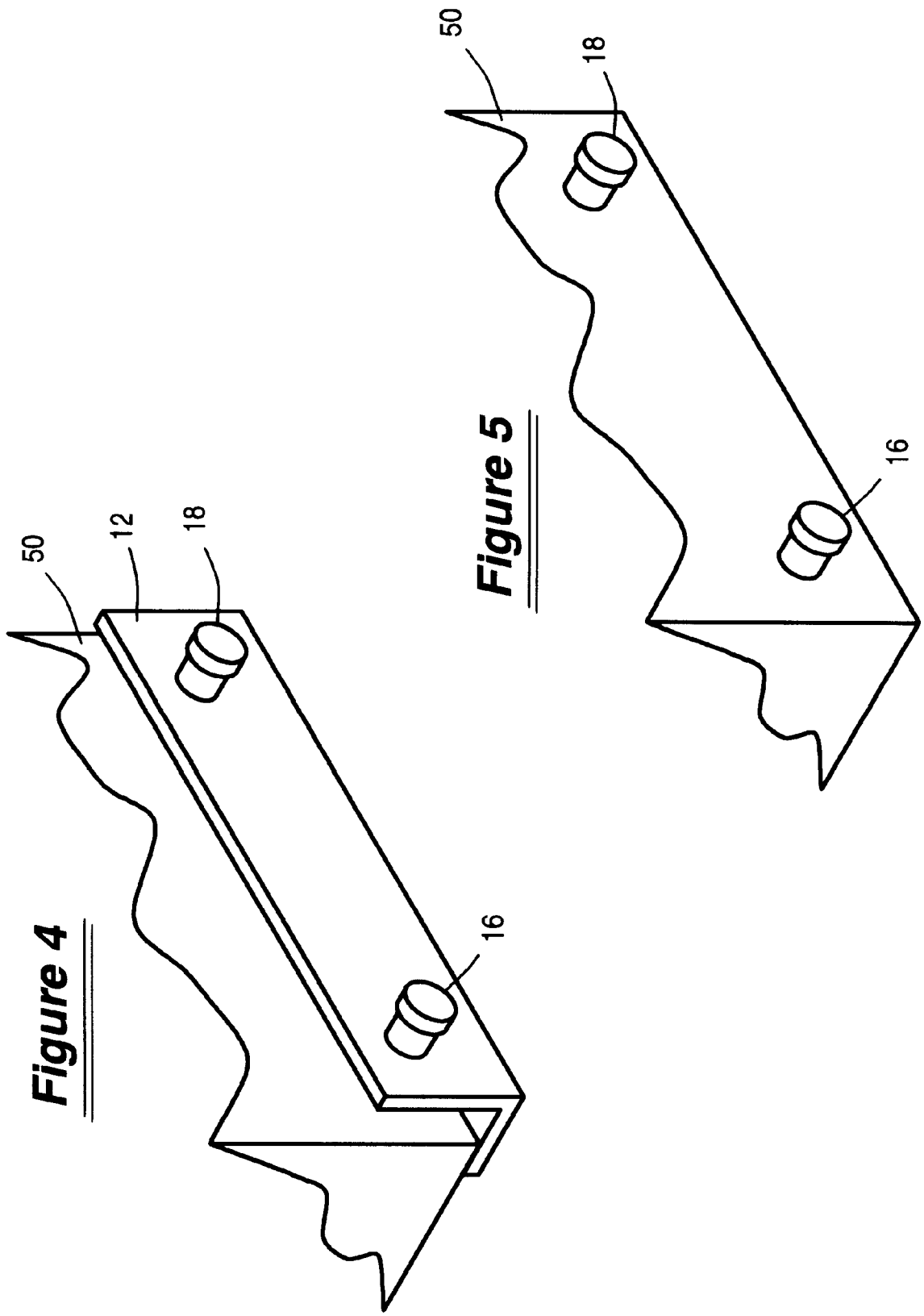

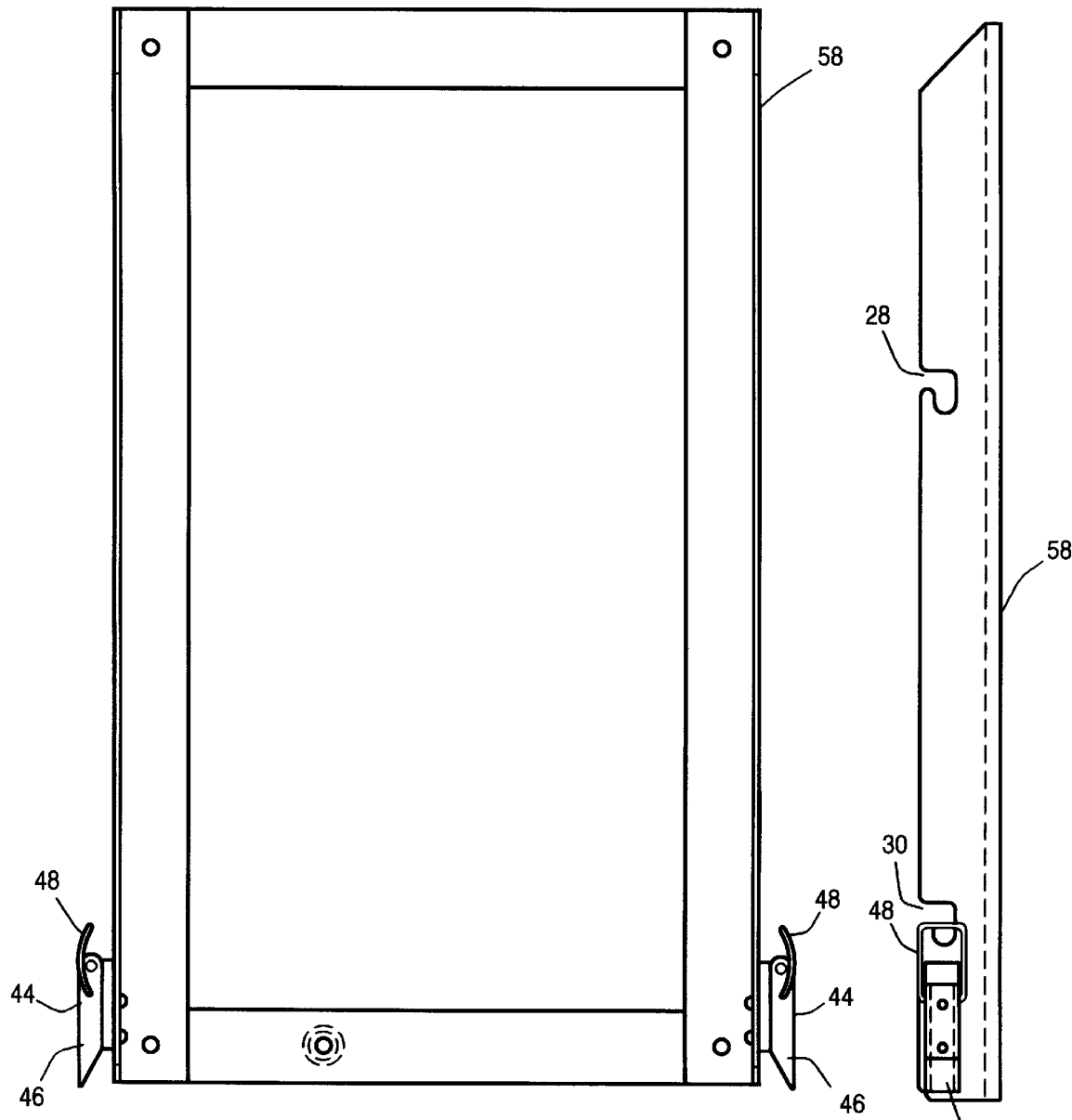
Figure 8
Figure 9
Figure 10

QUICK MOUNTING MECHANISM AND METHOD

FIELD OF THE INVENTION

The present invention relates to connection, and more particularly to connection providing rapid engagement and disengagement of components. The present invention also relates to supporting devices, and more particularly to cooperating parts that enable a component to be conveniently mounted in position.

BACKGROUND OF THE INVENTION

Electrical and other components (such as microprocessors or signal processors) are often mounted in modules or subassemblies which can be themselves connected or interconnected in a larger assembly or system. Among other advantages, such modularization permits removal for service and replacement of a faulty such module without any need to disassemble or repair the individual module itself at the user's site. This is particularly advantageous where the user's site is in a hazardous environment or where it is critical that operating downtime for the overall system be minimized. For such situations, it is particularly desirable that such modules be quickly and easily removable from, and replaceable in, the main assembly, while still providing an effective connection that would not itself make the overall assembly less reliable. In high shock or high stress environments, it is furthermore quite desirable that the resulting physical connection be firm and not easily unintentionally broken. The present invention fulfills these needs. For example, on a target practice firing range, if part of a moveable target breaks down, then the entire range must be shut down while repairs are made by maintenance or support personnel. In such a hazardous area, gloves are a necessity. Because of the shock impacts in the area, firm connection is required.

SUMMARY OF THE INVENTION

Accordingly, an object of the present invention is to provide apparatus and method for rapid connection and disconnection of a component or subunit from an assembly in which that component would be connected for normal operation.

Another object of the present invention is to provide apparatus and method for rapid connection and disconnection of a component with a larger assembly while still providing a firm, reliable physical connection between the component and the assembly.

A further object of the present invention is to provide apparatus and method for accomplishing quick connection and disconnection of a component with an assembly without requiring tools and which can even be worked with gloved hands.

Still another object of the present invention is to provide apparatus and method for rapid connection and disconnection which can be used with a variety of component racks or the like.

Briefly, these and other objects of the present invention are accomplished by providing a replaceable component with two protruding pins, bolts or other projections that are configured to engage correspondingly positioned captivating slots in or connected to a main assembly which that component is intended to be a part of. The slots are each preferably provided with a right angle to better retain the mounting projections. A releasable latch or other clamping device is connected to the main assembly near one of those slots to engage the correspondingly positioned mounting projection. After the component has been placed in the main assembly such that the projections have been placed in their respective mounting positions in the respective corresponding slots, at least one of the projections is held in place using the latch to engage that projection. It is preferred that two sets of such projections, slots and latch(es) be used, placed on opposite or parallel sides of the component to be mounted, for a firmer connection.

Other objects, advantages and novel features of the invention will become apparent from the following detailed description of the invention when considered in conjunction with the accompanying drawings.

BRIEF DESCRIPTION OF THE DRAWINGS

In the drawings,

FIG. 3 shows the equipment mount of FIG. 1 disassembled, but with a portion thereof shown in a different position than is shown in FIG. 2;

FIG. 4 shows one embodiment of one portion of the apparatus of FIGS. 1, 2 and 3 according to the present invention;

FIG. 5 shows another embodiment of the portion of the apparatus of FIGS. 1, 2 and 3 for which an embodiment is shown in FIG. 4;

FIG. 8 is a top view of one example of a portion of an equipment mount according to the present invention;

FIG. 9 is a side view of the mount portion of FIG. 8;

FIG. 10 is an end view of the mount portion of FIG. 8; and

DESCRIPTION OF THE PREFERRED EMBODIMENTS

Figure 1:
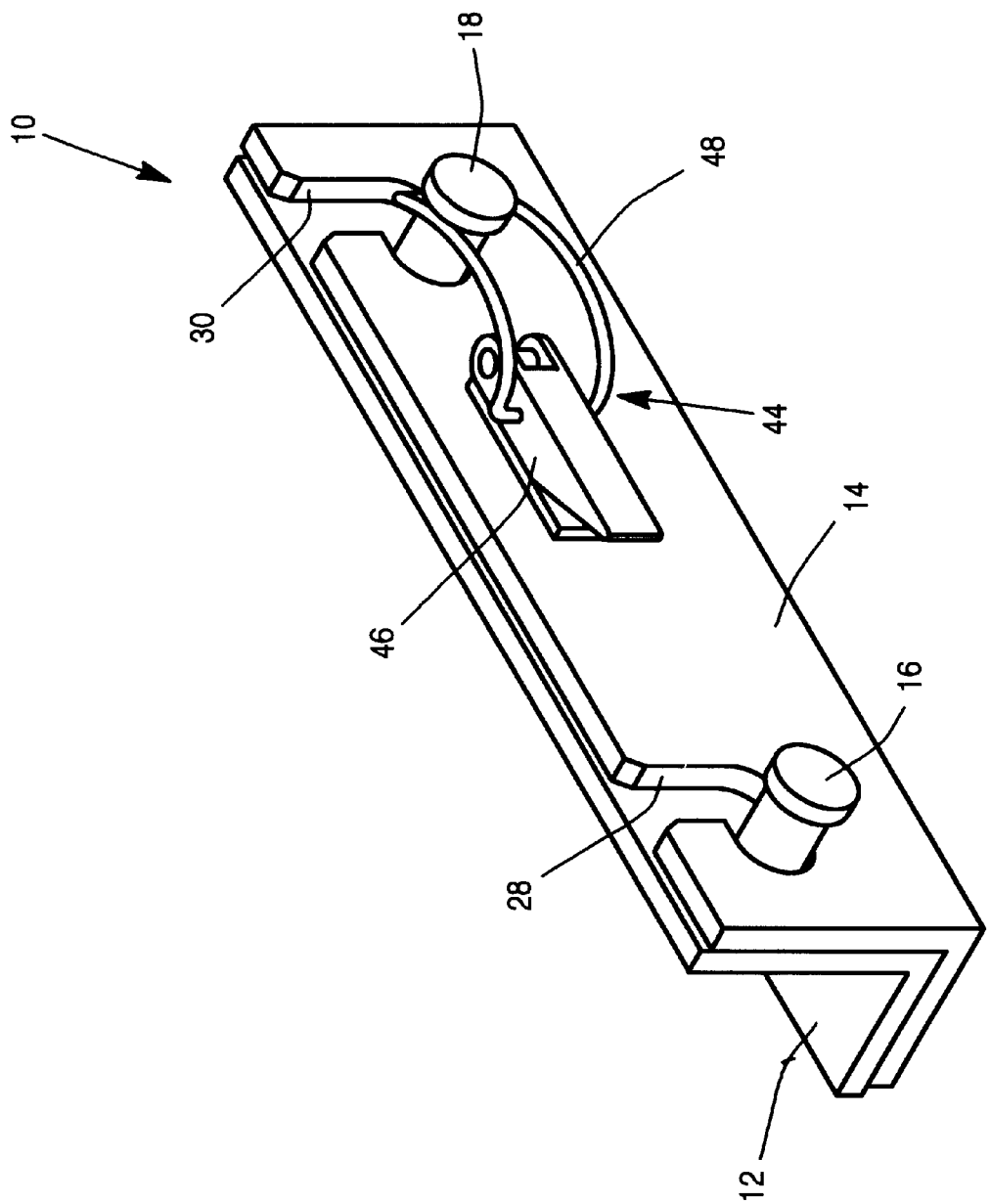
FIG. 1 shows a fully assembled equipment mount according to one embodiment of the present invention.
Figure 4A:
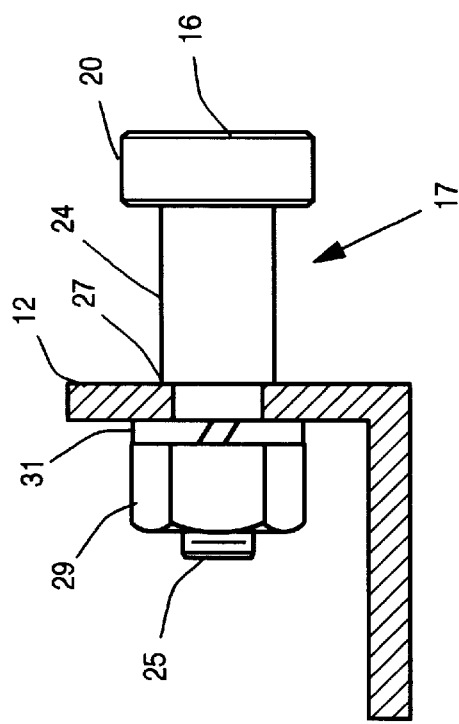
FIG. 4A is a side view of a portion of the structure of FIG. 4.
Figure 4B:
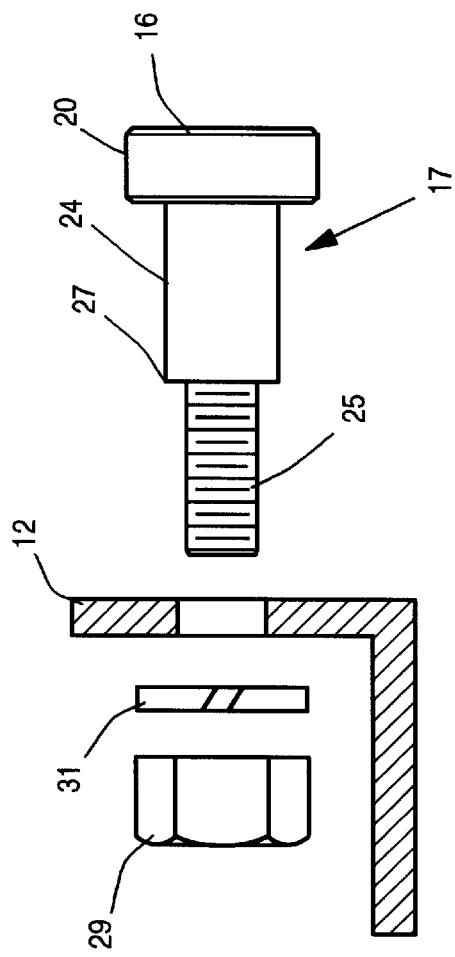
FIG. 4B is an exploded view of the structure of FIG. 4A.
Figure 6:
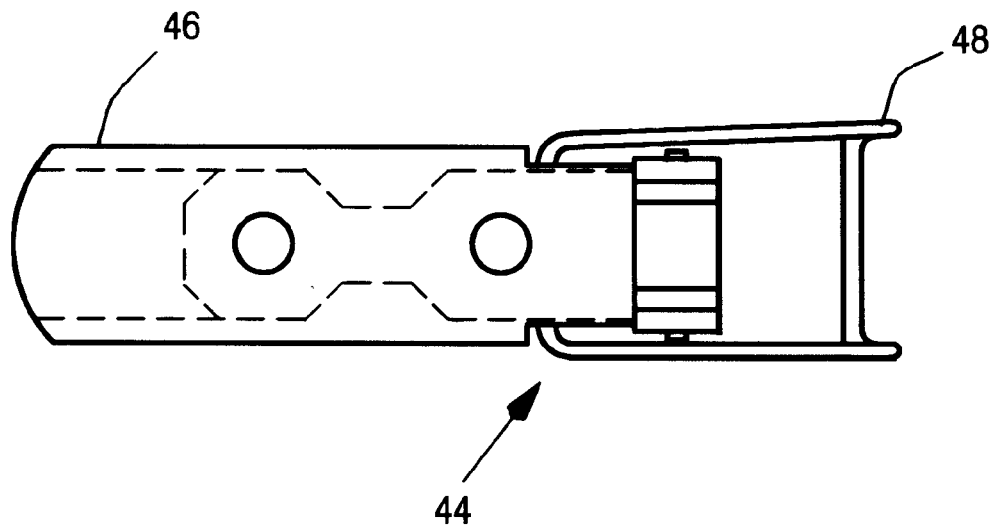
FIGS. 6 and 7 are different views of one embodiment of a latch that can be utilized in the apparatus of FIGS. 1, 2 and 3.
Figure 7:
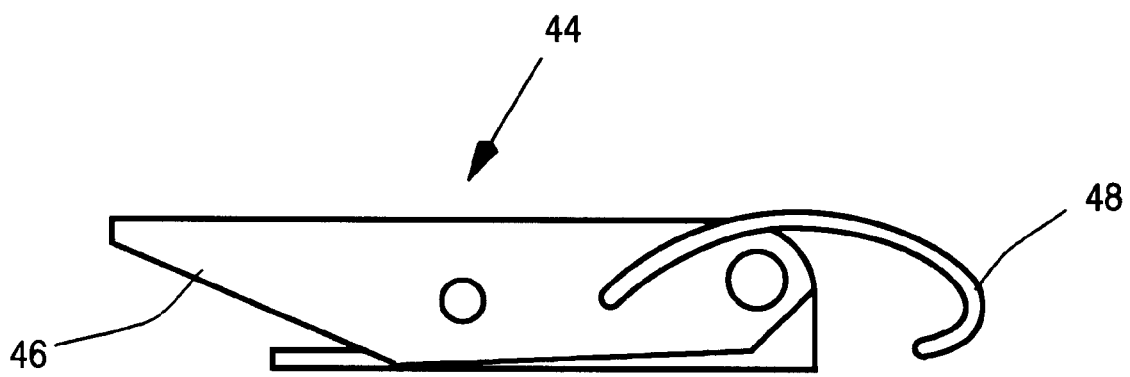

Referring now to the drawings, wherein like reference characters designate like or corresponding parts throughout the several views, there is shown in FIG. 1 a fully assembled component mount 10 including a component bracket 12 and a mounting bracket 14. Component bracket 12 includes two projections 16 and 18 each fixed to and extending from bracket 12. Each projection 16 and 18 preferably includes a respective head or end portion or knob 20 or 22 wider or having a larger diameter than the corresponding shaft or shank portion 24 or 26. For example, as shown in FIGS. 4A and 4B a single projection 16 can be formed of a standard shoulder screw 17 having a smooth milled portion below its head and which is larger in diameter than is the threaded portion 25. The threaded portion 25 extends from the end of the screw opposite that head. The different diameters of portions 24 and 25 provide therebetween a shoulder 27 where the threaded portion 25 begins. This shoulder 27 provides a standoff from bracket 12 for head 20 and shank 24. The head of such a shoulder screw then constitutes head 20. The threaded portion 25 of the shoulder screw extends through bracket 12, and is connected to the reverse side of bracket 12 with a nut 29 and washer 31 acting against the bracket 12 and shoulder 27. The head 20 and part of the shank 24 are held extended from bracket 12 by the shoulder 27 of the screw. The smooth portion below the head 20 forms shank portion 24. The use of at least two such projections is strongly preferred for a secure mounting.

Figure 2:
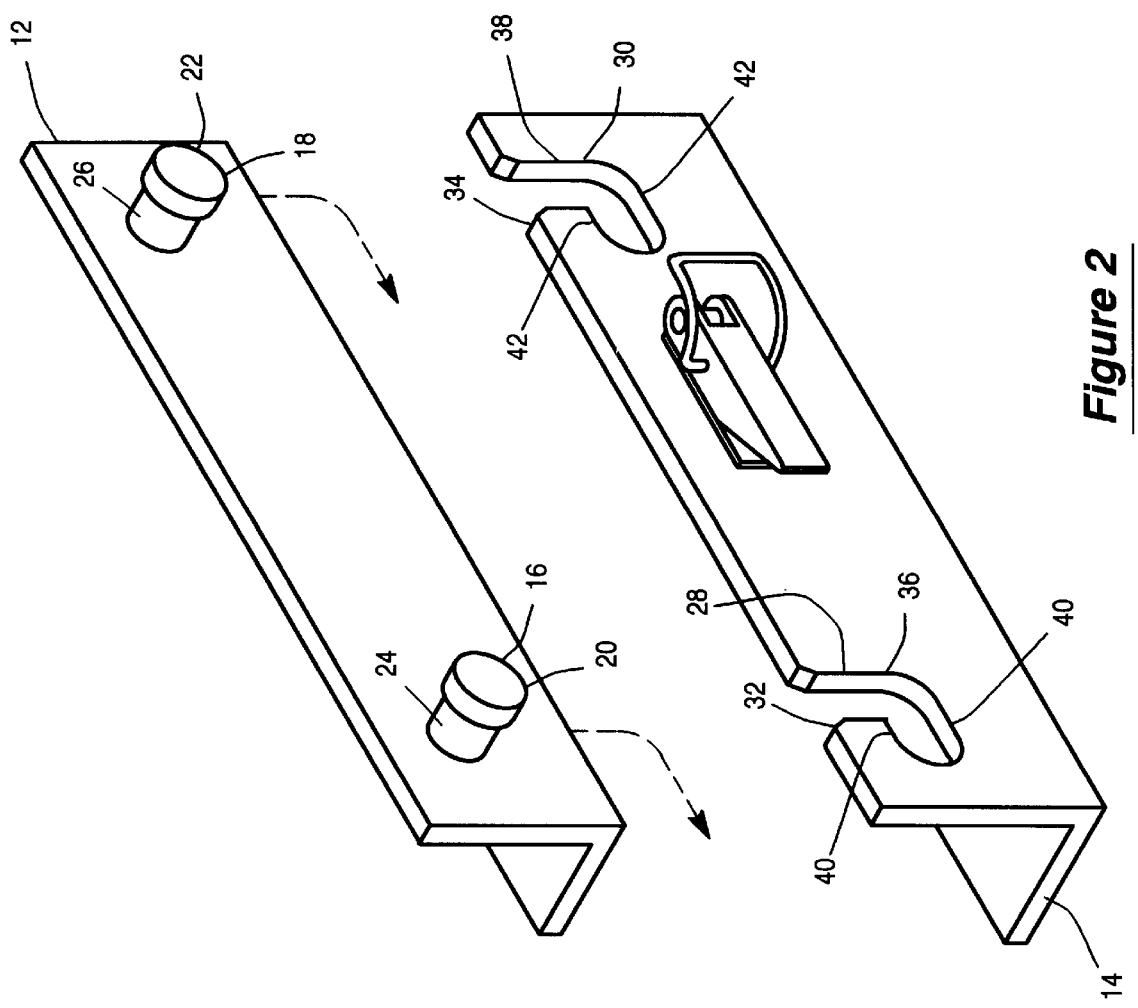
FIG. 2 shows the shows the equipment mount of FIG. 1 disassembled, with arrows showing how the two main components of FIG. 1 and FIG. 2 would be fit together to produce the combination of FIG. 1.
Figure 11:
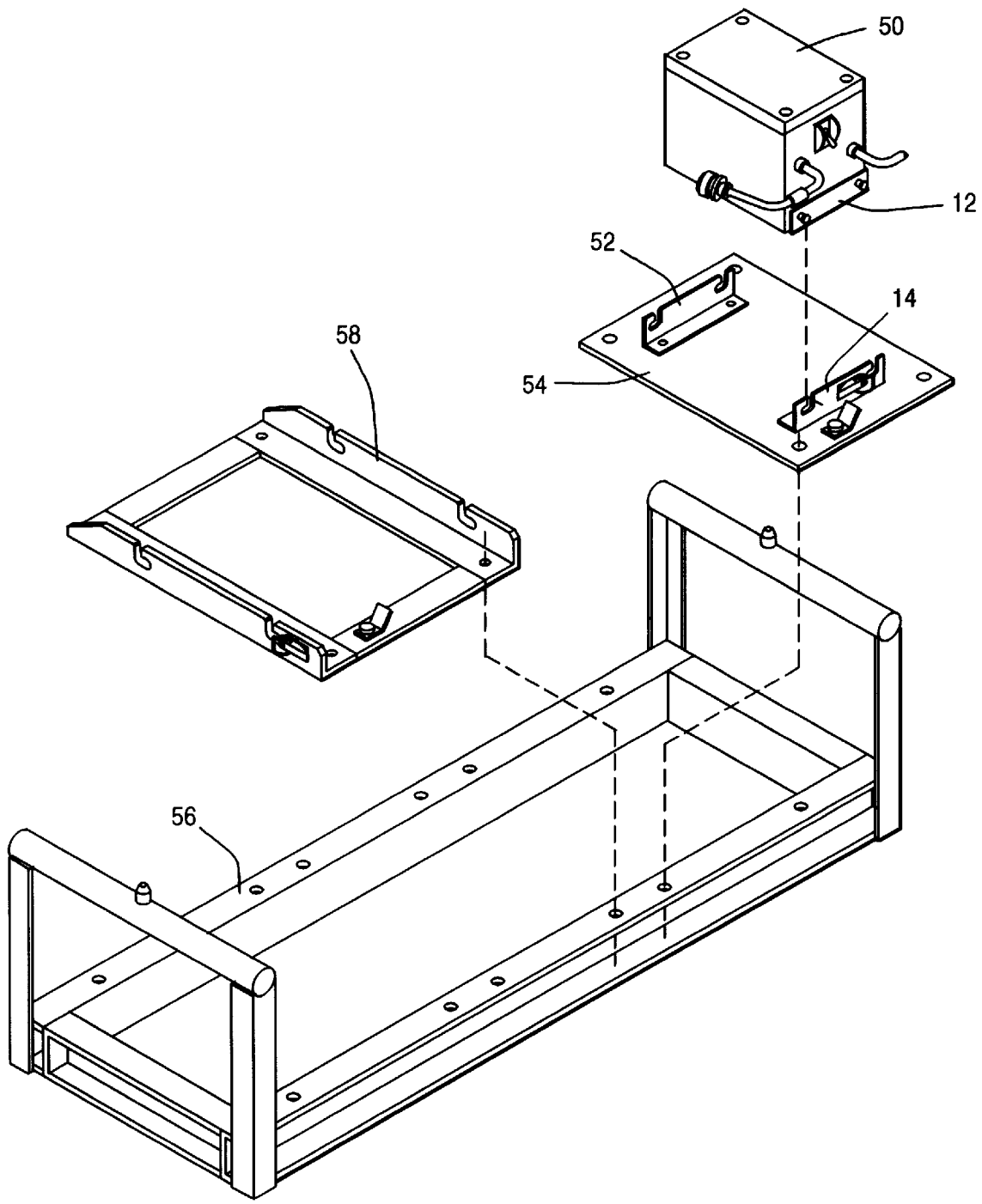
FIG. 11 shows an assembly including the mount portion of FIGS. 8–10 and another example of an equipment mount according to the present invention.

As shown in FIGS. 1, 2 and 11, mounting bracket 14 is configured to fit over component bracket 12 (or vice versa). Mounting bracket 14 is provided with two captivating openings or slots 28 and 30 respectively configured to accept a shank 24 or 26. One such opening is provided in mounting bracket 14 for each such projection of component bracket 12. As shown in FIGS. 1, 2, 9 and 11, each such opening is provided with a mouth or entrance portion 32 or 34 initially receiving shank 24 or 26, an extension portion 36 or 38 respectively extending from mouth 32 or 34, and a perpendicular portion 40 or 42 for secure retention of the corresponding projection 16 or 18. Mounting bracket 14 is also provided, at at least one of the openings 28 or 30, with a latch mechanism 44. Each mechanism 44 includes a latch 46 and a link or bail 48. As shown in FIG. 2, component bracket 12 is inserted into slots 28 and 30 of mounting bracket 14 and moved into the captivated position. The latch spring 48 is extended over the head of component bracket 12's mounting screws, pins, etc. 16 and 18 and levered into the lock position. After component bracket 12 has been placed in mounting bracket 14 such that projections 16 and 18 are in the respective perpendicular portions 40 or 42, latch 46 can then be flipped from the position shown in FIG. 2 to an open position (FIG. 3 shows an intermediate position) in which link 48 can be fitted over the knob or head 22 of a projection 18 engaged by slot 30. Latch 46 then can be flipped to the closed position shown in FIG. 1 so that projection 18 is firmly but releasably retained thereby. For example, a TL802DA latch including a TL802 latch handle and a DA link, available from DZUS Fastener Company, Inc., West Islip, N.Y., can be utilized as latch mechanism 44. Component bracket 12 and mounting bracket 14 are thereby held firmly together by cooperation of projections 16 and 18, slots 28 and 30, and latch mechanism 44, in a manner that can be quickly and easily connected and disconnected.

As shown in FIGS. 4 and 11, component bracket 12 can be more permanently connected (such as with screws or rivets) to an article or component 50. Alternatively, as shown in FIG. 5, component 50 can instead itself be provided with projections 16 and 18, for releasable connection to mounting bracket 14 as described above. In the practice of the present invention, it is anticipated that component 50 could be a piece of electrical equipment or the like to be thereby releasably mounted to a frame. One example of how this can be accomplished by the present invention is shown in FIG. 11. As shown in FIG. 11, component 50 has fixed thereto a front component bracket 12 and a rear component bracket (not shown). Front bracket 12 is configured (as described above) to fit in and engage a front mounting bracket 14, as described above. Likewise, the rear component bracket for component 50 is to be releasably engaged by a rear mounting bracket 52. As can be seen in FIG. 11, in each case a component bracket and a corresponding mounting bracket are provided on each of opposite or parallel sides of component 50 for secure but releasable retention of that component. Each mounting bracket 14 and 52 is fixed to a base or plate 54 which in turn can be fixed to a frame 56.

Alternatively, there can be fixed to frame 56 a larger mounting bracket 58 shown in FIGS. 8–11 which alone provides a mounting mechanism for opposite or parallel sides of a larger component (not shown) that is provided with corresponding component brackets or projections as described above and shown in FIG. 4 or FIG. 5.

Some of the many advantages of the present invention should now be readily apparent. For example, a novel fastening system has been shown which provides rapid engagement and disengagement of mounted hardware or components. Quick connect and disconnect is accomplished without tools and can be worked with gloved hands. The present mounting bracket can interface with a variety of component mounted bracketry or hardware. This system permits rapid and easy removal and replacement of mounted components. For example, on a target practice firing range, if part of a movable target breaks down, then the entire range must be shut down while repairs are made by maintenance or support personnel. In such a hazardous area, gloves are a necessity. Because of the shock impacts in the area, firm physical connection is required, and is provided by the present invention.

Obviously, many modifications and variations of the present invention are possible in light of the above teachings. It is therefore to be understood that the foregoing embodiments are presented by way of example only and that, within the scope of the appended claims and equivalents thereto, the invention may be practiced otherwise than as specifically described.

What is claimed is:

1. Apparatus for releasably retaining on a base an article having at least first and second mutually parallel sides, comprising:

first and second projections adapted to be connected to the article at the first parallel side;

third and fourth projections adapted to be connected to the article at the second parallel side, such that said first, second, third and fourth projections are coplanar;

wherein each of said first, second, third and fourth projections comprises a first portion proximal to the article and having a first width, and a second portion connected to said first portion but distal from the article and having a second width larger than the first width;

a first plate member adapted to be connected to the base, wherein said first plate member is provided with a first opening therethrough and a second opening therethrough, each of said first and second openings being respectively located in said first plate member and dimensioned to receive and accommodate said first projection and said second projection respectively;

a second plate member adapted to be connected to the base in a position parallel to said first plate member and separated from said first plate member by a distance sufficient to accommodate the article, said second plate member being provided with a third opening therethrough and a fourth opening therethrough, each of said first and second openings being respectively located in said second plate member and dimensioned to receive and accommodate said third projection and said fourth projection respectively;

first engaging means fixedly connected to and so positioned on said first plate member with respect to said first opening to releasably engage and retain said first projection within said first opening; and second engaging means fixedly connected to and so positioned on said second plate member with respect to said third opening to releasably engage and retain said third projection within said third opening;

wherein said first opening comprises a first opening portion extending from a first edge of said first plate member and a second opening portion connected to, perpendicular to and coplanar with said first opening portion;

wherein said second opening comprises a third opening portion extending from said first edge of said first plate member and a fourth opening portion connected to, perpendicular to and coplanar with said third opening portion;

wherein said third opening comprises a fifth opening portion extending from a first edge of said second plate member and a sixth opening portion connected to, perpendicular to and coplanar with said sixth opening portion;

wherein said fourth opening comprises a seventh opening portion extending from said first edge of said second plate member and an eighth opening portion connected to, perpendicular to and coplanar with said seventh opening portion;

wherein said first engaging means comprises a first latch connected to said first plate member and a first open bail pivotably connected to said first latch, said first bail being configured to fit over said second portion of said first projection and to releasably engage said first portion of said first projection;

and wherein said second engaging means comprises a second latch connected to said second plate member and a second open bail pivotably connected to said second latch, said second bail being configured to fit over said second portion of said third projection and to releasably engage said first portion of said third projection.

2. Apparatus for releasably retaining on a base an article having at least first and second mutually parallel sides, comprising:

first and second projections adapted to be connected to the article at the first parallel side;

third and fourth projections adapted to be connected to the article at the second parallel side, such that said first, second, third and fourth projections are coplanar;

wherein each of said first, second, third and fourth projections comprises a first portion proximal to the article and having a first width, and a second portion connected to said first portion but distal from the article and having a second width larger than the first width;

a first plate member adapted to be connected to the base, wherein said first plate member is provided with a first opening therethrough and a second opening therethrough, each of said first and second openings being respectively located in said first plate member and dimensioned to receive and accommodate said first projection and said second projection respectively;

a second plate member adapted to be connected to the base in a position parallel to said first plate member and separated from said first plate member by a distance sufficient to accommodate the article, said second plate member being provided with a third opening therethrough and a fourth opening therethrough, each of said first and second openings being respectively located in said second plate member and dimensioned to receive and accommodate said third projection and said fourth projection respectively;

first engaging means fixedly connected to and so positioned on said first plate member with respect to said first opening to releasably engage and retain said first projection within said first opening; and second engaging means fixedly connected to and so positioned on said second plate member with respect to said third opening to releasably engage and retain said third projection within said third opening;

wherein said first opening, said second opening, said third opening and said fourth opening each comprises a right-angled opening;

wherein said first engaging means comprises a first latch connected to said first plate member and a first open bail pivotably connected to said first latch, said first bail being configured to fit over said second portion of said first projection and to releasably engage said first portion of said first projection; and wherein said second engaging means comprises a second latch connected to said second plate member and a second open bail pivotably connected to said second latch, said second bail being configured to fit over said second portion of said third projection and to releasably engage said first portion of said third projection.

3. A method for retaining on a base an article having at least two opposite mutually parallel sides, comprising the steps of:

providing at least two opposite mutually parallel sides of the article with a plurality of knobbed projections;

before, during or after said step of providing a plurality of projections, providing the base with a like plurality of openings, each such opening being positioned and dimensioned to receive one of the projections;

after said step of providing a plurality of projections and said step of providing a plurality of openings, placing the article on the base such that each projection of the plurality of projections is received by an opening of the plurality of openings; and after said step of placing the article, moving each said projection in its corresponding opening such that the projections are retained thereby;

after said step of placing the article and said step of moving each said projection, releasably and engagingly clamping at least two of the projections in their corresponding openings, wherein said at least two projections are located at opposite mutually parallel sides of the article, and wherein said step of releasably and engagingly clamping comprises releasably clamping one of the at least two projections in its corresponding opening with a first latch connected to the base and a first open bail pivotably connected to the first latch, the first bail being configured to fit over and releasably engage the one projection.

4. The method as defined in claim 3 wherein said step of releasably and engagingly clamping further comprises releasably clamping another of the at least two projections in its corresponding opening with a second latch connected to the article and a second open bail pivotably connected to the second latch, the second bail being configured to fit over and releasably engage the another projection.

5. The method as defined in claim 4 wherein said step of moving each projection comprises the steps of:

first moving each said projection in a first direction; and after said first moving step, second moving each said projection in a second direction that is at a right angle to said first direction.

6. The method as defined in claim 3 wherein said step of moving each projection comprises the steps of:

first moving each said projection in a first direction; and after said first moving step, second moving each said projection in a second direction that is at a right angle to said first direction.

7. A method for retaining on a base an article having at least two opposite mutually parallel sides, comprising the steps of:

providing at least two opposite mutually parallel sides of the article with a plurality of knobbed projections;

before, during or after said step of providing a plurality of projections, providing the base with a like plurality of openings, each such opening being positioned and dimensioned to receive one of the projections;

after said step of providing a plurality of projections and said step of providing a plurality of openings, placing the article on the base such that each projection of the plurality of projections is received by an opening of the plurality of openings; and after said step of placing the article, releasably and engagingly clamping at least two of the projections in their corresponding openings, wherein said at least two projections are located at opposite mutually parallel sides of the article, and wherein said step of releasably and engagingly clamping comprises releasably clamping one of the at least two projections in its corresponding opening with a first latch connected to the base and a first open bail pivotably connected to the first latch, the first bail being configured to fit over and releasably engage the one projection.

8. The method as defined in claim 7 wherein said step of releasably and engagingly clamping further comprises releasably clamping another of the at least two projections in its corresponding opening with a second latch connected to the article and a second open bail pivotably connected to the second latch, the second bail being configured to fit over and releasably engage the another projection.

9. Apparatus for releasably retaining on a base an article having at least first and second mutually parallel sides, comprising:

first and second projections adapted to be connected to the base at the first parallel side;

third and fourth projections adapted to be connected to the article at the second parallel side, such that said first, second, third and fourth projections are coplanar;

wherein each of said first, second, third and fourth projections comprises a first portion proximal to the article and having a first width, and a second portion connected to said first portion but distal from the article and having a second width larger than the first width;

a first plate member adapted to be connected to the base, wherein said first plate member is provided with a first opening therethrough and a second opening therethrough, each of said first and second openings being respectively located in said first plate member and dimensioned to receive and accommodate said first projection and said second projection respectively;

a second plate member adapted to be connected to the base in a position parallel to said first plate member and separated from said first plate member by a distance sufficient to accommodate the article, said second plate member being provided with a third opening therethrough and a fourth opening therethrough, each of said first and second openings being respectively located in said second plate member and dimensioned to receive and accommodate said third projection and said fourth projection respectively;

first engaging means fixedly connected to and so positioned on said first plate member with respect to said first opening to releasably engage and retain said first projection within said first opening; and second engaging means fixedly connected to and so positioned on said second plate member with respect to said third opening to releasably engage and retain said third projection within said third opening, wherein said first engaging means comprises a first latch connected to said first plate member and a first open bail pivotably connected to said first latch, said first bail being configured to fit over said second portion of said first projection and to releasably engage said first portion of said first projection.

10. The apparatus as defined in claim 9 wherein:

said second engaging means comprises a second latch connected to said second plate member and a second open bail pivotably connected to said second latch, said second bail being configured to fit over said second portion of said third projection and to releasably engage said first portion of said third projection.

* * * * *